March 16, 1965 P. S. SWARTZ 3,174,083
SUPERCONDUCTIVE DEVICE
Filed June 14, 1962

Inventor:
Paul S. Swartz,
by Paul R. Webb, II
His Attorney.

United States Patent Office 3,174,083

Patented Mar. 16, 1965

3,174,083

SUPERCONDUCTIVE DEVICE

Paul S. Swartz, Schenectady, N.Y., assignor to General Electric Company, a corporation of New York Filed June 14, 1962, Ser. No. 202,517
2 Claims. (Cl. 317—158)

This invention relates to high field superconductive devices and more particularly to superconductive devices including a plurality of stacked high field superconducting members.

As is well known, superconduction is a term describing the type of electrical current conduction existing in certain materials cooled below a critical temperature, $T_c$, where resistance to the flow of current is essentially non-existent. While the existence of superconductivity in many metals, metal alloys and metal compounds has been known for many years, the phenomenon has been more or less treated as a scientific curiosity until comparatively recent times. The awakened interest in superconductivity may be attributed, at least in part, to technological advances in the arts where their properties would be extremely advantageous in generators, direct current motors and low frequency transformers, and to advances in cryogenics which removed many of the economic and scientific problems involved in extremely low temperature operations.

A high field superconductive body having an aperture therethrough with a magnetic field confined therein will be required with a diameter of several inches and a length of several feet. Such a device might confine a high magnetic field in excess of 20 kilogauss. Large, expensive apparatus and a substantial power supply will be required to produce this device. If a solenoid is employed to produce the device, it will require extensive and expensive quantities of solenoid windings and a substantial power supply for these windings. Thus, it would be desirable to provide a more economical high field superconductive device. The present application is directed to an improved high field superconductive device having a substantially greater length than its diameter.

It is an object of my invention to provide a high field superconductive device.

It is another object of my invention to provide a high field superconductive device having a substantially greater length than its diameter.

It is a further object of my invention to provide a high field superconductive device including a plurality of stacked, high field superconducting members.

In carrying out my invention in one form, a high field superconductive device comprises a plurality of stacked, high field superconducting members, each of said members having a central aperture therethrough defining a continuous aperture through said members, and means to maintain the temperature of said members below their critical temperatures.

These and various other objects, features and advantages of the invention will be better understood from the following description taken in connection with the accompanying drawing in which.

Figure 1:
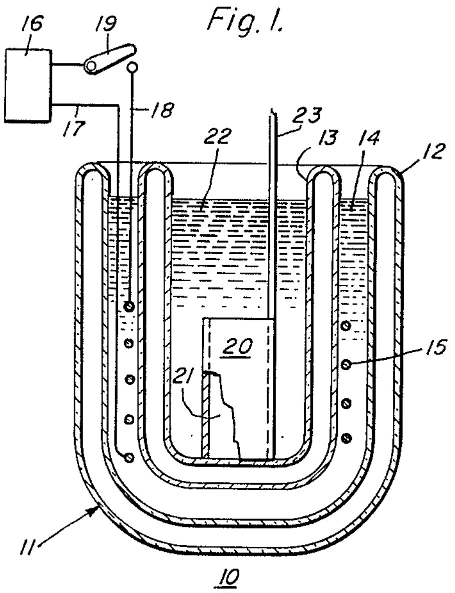
FIGURE 1 is a sectional view of apparatus for forming high field superconductive members.

In FIGURE 1, apparatus is shown generally at 10 for forming high field superconductive members. Apparatus 10 comprises an insulated container 11 having an outer insulated vessel 12 and an inner insulated vessel 13 separated by liquid nitrogen 14. A solenoid 15, which is positioned in liquid nitrogen 14, is connected to a power source 16 by means of leads 17 and 18. A switch 19 is provided in lead 18 between solenoid 15 and power source 16 to energize and de-energize the solenoid 15 to provide a magnetic field. If desired, solenoid 15 can be made of a high field superconductive material and positioned directly in liquid helium. A high field superconductive member 20 containing $Cb_3Sn$ and having a central aperture 21 therethrough is shown positioned in liquid helium 22 in vessel 13. A rod 23 is attached to the upper end of member 20 to manually or automatically move member 20 into and out of liquid helium 22.

Figure 2:
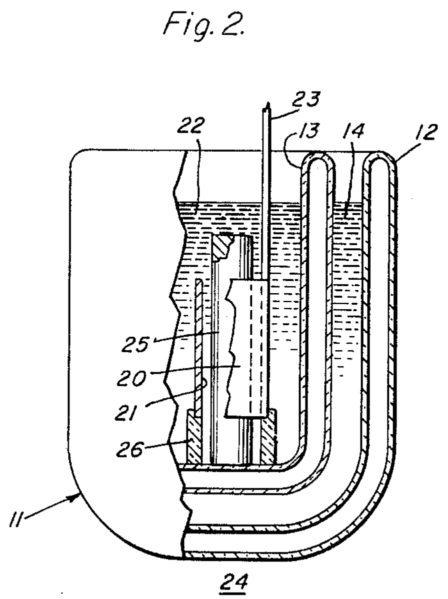
FIGURE 2 is a sectional view of a portion of modified apparatus for forming high field superconductive members.

In FIGURE 2 of the drawing, a portion of modified apparatus 24 is shown for forming a high field superconductive member. The apparatus of FIGURE 2 is similar to the apparatus of FIGURE 1 except that a rod of magnetic material 25 is supported on the bottom wall of vessel 13 within aperture 21 of member 20. Rod 25 is also positioned substantially within solenoid 15 and extends outwardly therefrom at both ends. A support member 26 is positioned within helium 22 and surrounds rod 25.

A high field superconductive device is formed by providing a plurality of stacked high field superconducting members, each of said members having a central aperture therethrough defining a continuous aperture through said members, and means to maintain the temperature of said members below their critical temperature. Such a device is formed with a length substantially greater than its diameter without employing an excessively long solenoid with associated substantial power requirements.

An insulated container is provided with an outer insulated vessel and an inner insulated vessel between which a solenoid is positioned in liquid nitrogen. Power is supplied to the solenoid to produce a magnetic field. The inner vessel is filled with liquid helium to reduce the temperature of a member to be inserted therein below its critical temperature. As a high field superconductive member, for example, containing $Cb_3Sn$ and having an aperture therethrough is moved manually or automatically into the liquid helium and within the surrounding magnetic field produced by the solenoid, a magnetic field which is generated parallel to the axis of the member aperture is produced within the aperture. The liquid helium cools the member below its critical temperature whereby the member becomes superconducting and confines the magnetic field within its aperture. If desired, the member is placed in the inner vessel after which the solenoid is energized to produce a magnetic field. The inner vessel is then filled with liquid helium to reduce the temperature of the member below its critical temperature.

The power supply is terminated and the member is removed from the insulated container to a similar container without an associated power supply. After the member has become superconducting, a magnetic field strength will exist within its aperture which field strength is equal to the strength of the magentic field produced by the solenoid. A plurality of the superconductive members are made superconducting and stacked within the second container so that a unidirectional magnetic field is attained. In this manner, the stacked members define a continuous aperture therethrough in which is confined a magnetic field. The stacked members within the container and surrounded by liquid helium comprise a high field superconductive device.

While a solenoid associated with a power source is desirable to produce a magnetic field within the aperture of each of the superconducting members, other means are available for producing the magentic field. For example, a superconductive solenoid containing $Cb_3Sn$ may be placed directly in the liquid helium within the vessel and connected to a power source.

The magentic field strength of each of the superconducting members can also be increased above the magnetic field strength of the solenoid by positioning a magentic material within the member aperture and within the surrounding solenoid. It is preferred that the magnetic material extends beyond the ends of the solenoid during the insertion of the member into the solenoid. The magentic field strength of the member aperture is equal to the sum of the field strengths produced by the solenoid and the magnetic material. A plurality of these high field superconducting members can be stacked together with a unidirectional magnetic field and maintained below their critical temperature to form a high field superconductive device. In this manner, a superconductive device is produced with a length substantially greater than its diameter without employing an excessively long solenoid with associated substantial power requirements.

In the operation of the apparatus shown in FIGURE 1 of the drawing, switch 19 is closed to activate solenoid 15 from power supply 16 whereby a magnetic field is produced. Superconductive member 20 with its aperture 21 is initially at a sufficiently high temperature so that it is not superconducting. As member 20 is moved downwardly by rod 23 into liquid helium 22 surrounded by solenoid 15, a magnetic field generally parallel to the axis of the member aperture is produced within the aperture. Member 20 is cooled simultaneously below its critical temperature whereby it becomes superconducting and confines the magnetic field within its aperture 21. Subsequently, switch 19 is opened to deactivate solenoid 15 and member 20 is transferred to a similar insulated container.

The operation of apparatus 24 in FIGURE 2 of the drawing is similar to the operation of apparatus 10 in FIGURE 1 of the drawing. However, in FIGURE 2, magnetic material 25 in the form of a rod is supported on the bottom wall of vessel 13 within aperture 21 of member 20. Rod 25 is also positioned substantially within solenoid 15. Support member 26 is positioned within helium 22 and surrounds rod 25. When member 20 is moved downwardly into liquid helium 22 within solenoid 15, it surrounds magnetic material 25 and rests on support 26. A magnetic field is produced within aperture 21 of member 20 and is confined therein by the cooling of member 20 below its critical temperature. The magnetic field strength within aperture 21 is equal to the magnetic field strengths produced by solenoid 15 and rod 25. If desired, magnetic material 25 can be positioned within aperture 21 of member 20 prior to its insertion into liquid helium 22. After member 21 becomes superconducting, switch 19 is opened to deactivate solenoid 15. Member 20 is then transferred to a similar insulated container.

Figure 3:
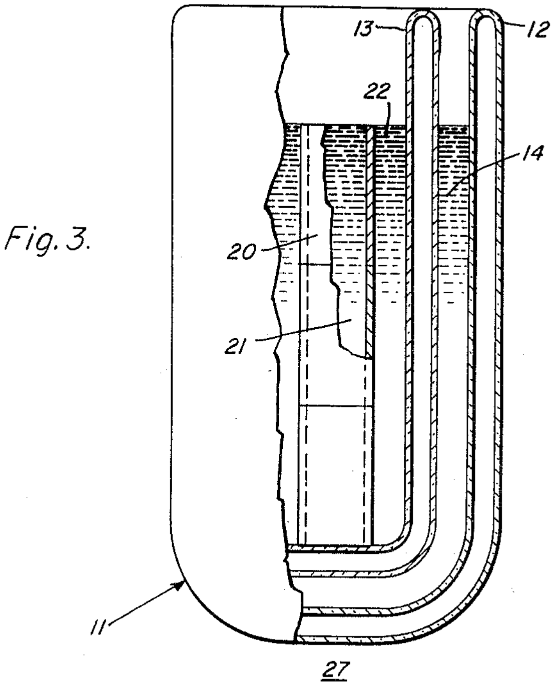
FIGURE 3 is a sectional view of a high field superconductive device embodying my invention.

In FIGURE 3 of the drawing, a high field superconductive device 27 is shown. This device comprises a plurality of stacked, high field superconducting members 20, each of which has a central aperture therethrough. After each of these members is made superconducting in the apparatus shown in FIGURE 1 or 2 of the drawing, its rod 23 is removed and the members are stacked with a unidirectional magnetic field within inner vessel 13 of insulated container 11. Liquid helium 22 surrounds members 20 to maintain these members below their critical temperatures. Members 20 are aligned axially so that their apertures 21 define a continuous central aperture through the members. In this manner, a device is formed with a length substantially greater than its diameter.

While other modifications of this invention and variations thereof which may be employed within the scope of the invention have not been described, the invention is intended to include such that may be embraced within the following claims.

What I claim as new and desire to secure by Letters Patent of the United States is:

1. A high field superconductive device comprising a plurality of stacked high field superconducting members, each of said members having a central aperture therethrough defining a continuous aperture through said members, and means to maintain the temperature of said members below their critical temperatures.

2. A high field superconductive device comprising an insulated container, a plurality of stacked high field superconducting members positioned in said container, each of said members having a central aperture therethrough defining a continuous aperture through said members, and a coolant within said container contacting the exterior walls of said members to maintain the temperature of said members below their critical temperatures.

No references cited.

JOHN F. BURNS, *Primary Examiner.*